(12) United States Patent
Uto

(10) Patent No.: US 6,781,442 B2
(45) Date of Patent: Aug. 24, 2004

(54) SELF-BIAS ADJUSTMENT CIRCUIT

(75) Inventor: Ken-ichi Uto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/947,445

(22) Filed: Sep. 7, 2001

(65) Prior Publication Data

US 2002/0044009 A1 Apr. 18, 2002

(30) Foreign Application Priority Data

Sep. 8, 2000 (JP) .......................................... 2000-272605

(51) Int. Cl.⁷ ................................................. G05F 1/10
(52) U.S. Cl. ...................................... 327/540; 330/267
(58) Field of Search ................................. 327/540, 541, 327/543, 530, 538, 78, 143, 307; 330/267, 269, 273; 323/313

(56) References Cited

U.S. PATENT DOCUMENTS

| | | | |
|---|---|---|---|
| 4,142,110 A | | 2/1979 | Weber ......................... 327/307 |
| 4,535,294 A | | 8/1985 | Ericksen et al. ............ 327/309 |
| 4,672,327 A | * | 6/1987 | Wittlinger .................... 330/269 |
| 5,297,097 A | * | 3/1994 | Etoh et al. ................... 365/226 |
| 5,347,577 A | * | 9/1994 | Takato et al. ............... 379/413 |
| 5,537,024 A | * | 7/1996 | Lang .................... 320/DIG. 21 |
| 5,714,895 A | * | 2/1998 | Mori et al. ................... 327/104 |
| 5,796,781 A | | 8/1998 | DeAndrea et al. .......... 375/288 |
| 5,844,439 A | | 12/1998 | Zortea .......................... 327/307 |
| 5,994,888 A | * | 11/1999 | Yanagawa .................... 323/313 |

FOREIGN PATENT DOCUMENTS

| | | | |
|---|---|---|---|
| EP | 0380976 A | 8/1990 | ............. H03F/3/45 |
| EP | 0489927 A | 6/1992 | ........... H04L/25/03 |
| JP | 02177724 | 7/1990 | .......... H03K/19/09 |
| JP | A3208369 | 9/1991 | |
| JP | 06260920 | 9/1994 | .......... H03K/19/00 |

OTHER PUBLICATIONS

Rein, IEEE Journal of Solid–State Circuits, vol. 31, No. 8, pp. 1076–1091, (1996).

* cited by examiner

*Primary Examiner*—Timothy P. Callahan
*Assistant Examiner*—Linh M. Nguyen
(74) *Attorney, Agent, or Firm*—Birch, Stewart, Kolasch & Birch, LLP

(57) ABSTRACT

The self-bias adjustment circuit is provided on the previous stage of an internal circuit. This self-bias adjustment circuit adjusts a bias of an input signal and supplies an appropriate signal to the internal circuit. The self-bias adjustment circuit includes a detection circuit 11a that detects the bias voltage of the input signal, and a superposing circuit 11b that superposes a correction voltage for correcting the bias voltage to a predetermined value on the input signal on the basis of the bias voltage detected by the detection circuit. The result signal is supplied to the internal circuit.

10 Claims, 4 Drawing Sheets

SELF-BIAS ADJUSTMENT CIRCUIT

FIELD OF THE INVENTION

The present invention relates to a self-bias adjustment circuit, arranged on a previous stage of an internal circuit, for supplying an appropriate signal to an internal circuit.

BACKGROUND OF THE INVENTION

As a conventional self-bias adjustment circuit, for example, a self-bias adjustment circuit disclosed in a reference "Design Considerations for Very-High-Speed Si-Bipolar IC's Operating up to 50 Gb/s", H.-M. rein (IEEE Journal of Solid-State Circuits, vol. 31, no. 8, pp. 1076–1090, August 1996). FIG. 6 is a schematic diagram showing the configuration of an integrated circuit including the conventional self-bias adjustment circuit. This integrated circuit 82 comprises an input terminal 87 which receives a signal current I80 from an output circuit 84 of another integrated circuit 81 through a signal transmission line 86, a terminal resistor 88 (resistance RS80) arranged between a high-potential side 82a of the power supply of the integrated circuit 82 and the input terminal 87, and an internal circuit 89.

A potential difference VGAP80 is generated across the low-potential side 81b of the power supply of the other integrated circuit 81 and a low-potential side 82b of the power supply of the integrated circuit 82. The output circuit 84 of the other integrated circuit 81 has a signal current source 85 to output the signal current I80 from the signal current source 85 to the signal transmission line 86. The terminal resistor 88 constitutes a self-bias adjustment circuit 91. The power supply voltage of the integrated circuit 81 and the power supply voltage of the integrated circuit 82 are equal to each other. More specifically, equation (1) is established:

$$(VCC81 - VEE81) = (VCC82 - VEE82) \tag{1}$$

In this equation, VCC81 denotes the voltage of a high-potential voltage side 81a of the power supply of the integrated circuit 81, VEE81 denotes the voltage of the low-potential side 81b of the power supply of the integrated circuit 81, VCC82 denotes the voltage of the high-potential side 82a of the power supply of the integrated circuit 82, and VEE82 denotes the voltage of the low-potential side 82b of the power supply of the integrated circuit 82. The internal circuit 89 may be an internal circuit having a single-phase output or an internal circuit having a differential output. The output impedance of the output circuit 84 is equal to the impedance of the signal transmission line 86. The impedance of the terminal resistor 88 is equal to the impedance of the signal transmission line 86. The internal circuit 89 has a high-input impedance of several kΩ or more.

The signal current I80 output from the output circuit 84 is flowed into the high-potential side 82a of the power supply of the integrated circuit 82 through the input terminal 87 and the terminal resistor 88. If a potential difference VGAP80 is 0 volt, a DC voltage VDC80 across the input terminal 87 and an input terminal 90 can be expressed by equation (2). A signal amplitude (amplitude of signal voltage) VAC80 between the input terminals 87 and 90 can be expressed by equation (3).

$$VDC80 = VCC82 - (I80 \times RS80)/2 \tag{2}$$

$$VAC80 = I80 \times RS80 \tag{3}$$

When bias design for the internal circuit 89 is performed in accordance with signal voltages expressed by equation (2) and equation (3), the internal circuit 89 can be normally operated. In this manner, a self-bias adjustment circuit can be constituted by a simple circuit obtained by the terminal resistor 88 having the function of impedance matching and the function of terminating.

The integrated circuit 81 and the integrated circuit 82 are not necessarily mounted on the same substrate or in the same housing. In addition, even though the integrated circuit 81 and the integrated circuit 82 are mounted on the same substrate, voltage drop caused by a pattern resistor may occur because a pattern is drawn on the substrate. For this reason, the potential difference VGAP80 may not be 0 volt. The DC voltage VDC80 and the signal amplitude VAC80 can be expressed by equations (4) and (5), respectively, using the voltage VEE82:

$$VDC80 = VCC82 - (I80 \times RS80)/2 + VGAP80 \tag{4}$$

$$\begin{aligned} VAC80 &= (VCC82 - ((VCC82 - (I80 \times RS80)/2) + \\ &\quad VGAP80)) \times 2 \\ &= ((I80 \times RS80)/2) - VGAP80) \times 2 \\ &= (I80 \times RS80) - 2VGAP80 \end{aligned} \tag{5}$$

According to equation (4), the DC voltage VDC80 across the input terminals 87 and 90 is shifted from a design value at which the internal circuit 89 can be normally operated by volts corresponding to the potential difference VGAP80. According to equation (5), the signal amplitude VAC80 across the input terminals 87 and 90 is shifted from a design value by (−2×VGAP80) volts.

As a conventional self-bias adjustment circuit for avoiding a signal voltage from being shifted by the potential difference VGAP80, a self-bias adjustment circuit in which a capacitor is inserted on a signal line for transmitting an input signal, a signal component passes through the capacitor, and a DC voltage expressed by equation (2) is superposed on the signal component is known. In this self-bias adjustment circuit, the influence of the potential difference VGAP80 is suppressed by the capacitor inserted on the signal line.

However, according to the above-described conventional self-bias adjustment circuit (Design Considerations for Very-High-Speed Si-Bipolar IC's Operating up to 50 Gb/s"), since the self-bias adjustment circuit has no function of suppressing the influence of the potential difference VGAP80, a shift between a bias voltage and a signal amplitude at the input terminal 90 of the internal circuit 89 is generated, and the internal circuit 89 may not be appropriately operated. In addition, the signal amplitude is disadvantageously deteriorated.

According to the conventional self-bias adjustment circuit having the capacitor, since a capacitor is inserted on a signal line for transmitting an input signal, when the input signal has a frequency component of a wide band, the low-frequency component of the input signal is attenuated, and the input signal is disadvantageously degraded. When the capacitance of the capacitor is set large (e.g., 1 nF or more) to pass the signal components of the wide band, the capacitor increases in size. For this reason, the capacitor is not easily formed in the integrated circuit, and the capacitor must be formed out of the integrated circuit. Therefore, peripheral devices increases in size, and the cost disadvantageously increase.

SUMMARY OF THE INVENTION

It is an object of this invention to obtain a self-bias adjustment circuit which can appropriately operate the internal circuit while suppressing the size and cost of the device from being increased and which can reduce a deterioration of a signal amplitude.

In the self-bias adjustment circuit according to the present invention, a detection unit detects the bias voltage of the input signal, and a superposing unit superposes the correction voltage for correcting the bias voltage to the predetermined voltage on the input signal to output the signal to the internal circuit.

Other objects and features of this invention will become apparent from the following description with reference to the accompanying drawings.

DESCRIPTION OF THE PREFERRED EMBODIMENTS

Embodiments of the present invention will be described below with reference to the accompanying drawings. However, the present invention is not limited to the embodiments.

Figure 1:
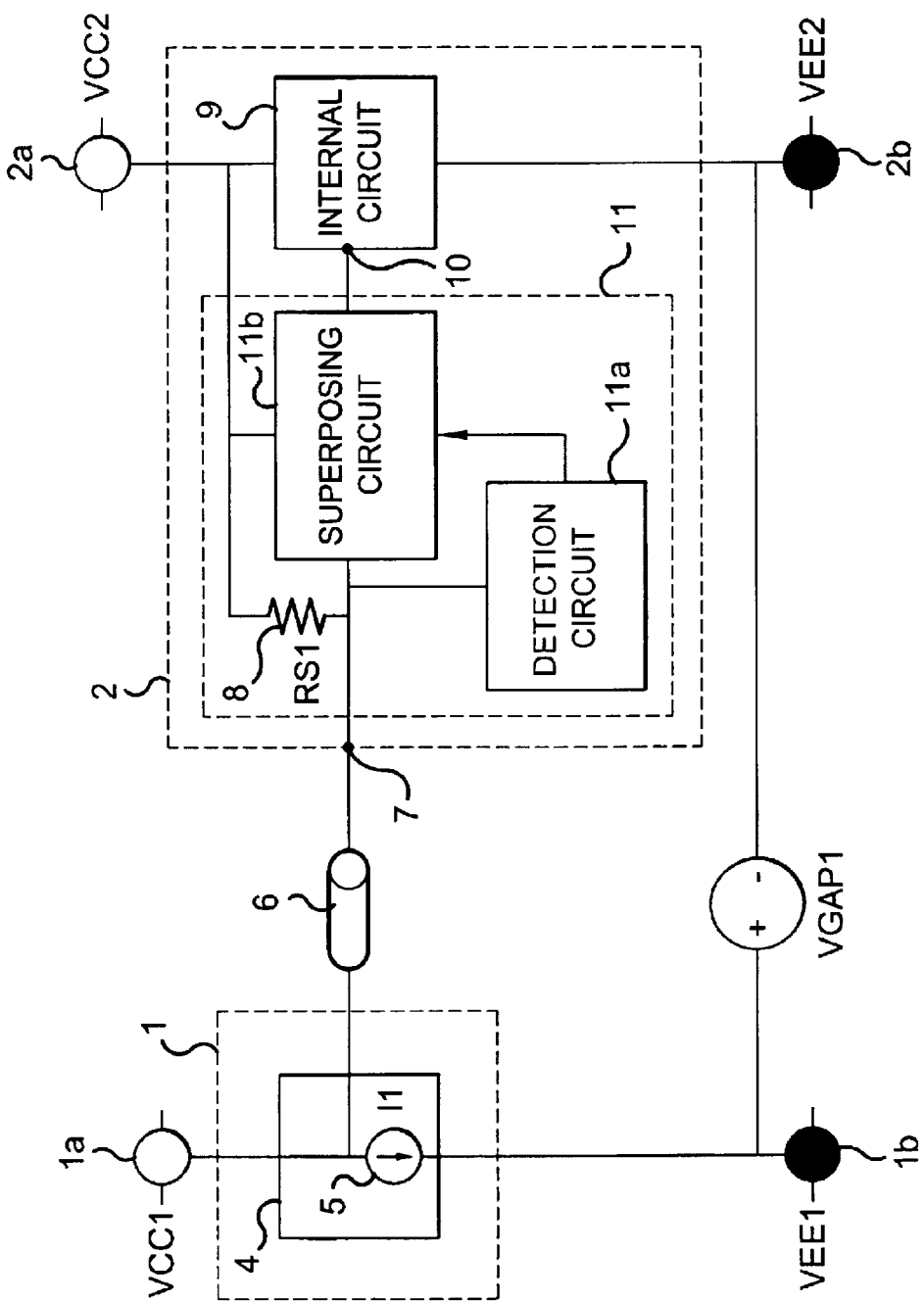
FIG. 1 is a diagram showing the schematic configuration of an integrated circuit according to a first embodiment of the present invention.

FIG. 1 is a diagram showing the schematic configuration of an integrated circuit according to a first embodiment of the present invention. This integrated circuit 2 comprises the input terminal 7 which receives a signal current I1 from the output circuit 4 of another integrated circuit 1 through the signal transmission line 6, the terminal resistance 8 (resistance RS1), which is arranged between a high-potential side 2a of the power supply of the integrated circuit 2 and the input terminal 7, the internal circuit 9, the detection circuit ha for detecting a bias voltage of an input signal input through the input terminal 7, and the superposing circuit 11b, arranged between the input terminal 7 of the integrated circuit 2 and an input terminal 10 of the internal circuit 9, for superposing a correction voltage for correcting the bias voltage to a predetermined value on the input signal on the basis of a detection result of the detection circuit 11a.

A potential difference VGAP1 is generated between a low-potential side 1b of the power supply of the integrated circuit 1 and a low-potential side 2b of the power supply of the integrated circuit 2. The output circuit 4 of the integrated circuit 1 has a signal current source 5 to output the signal current I1 from the signal current source 5 to the signal transmission line 6. The terminal resistance 8, the detection circuit 11a, and the superposing circuit 11b constitute a self-bias adjustment circuit 11. The power supply voltage of the integrated circuit 1 and the power supply voltage of the integrated circuit 2 are equal to each other. More specifically, equation (6) is established:

$$(VCC1-VEE1)=(VCC2-VEE2) \quad (6)$$

In this equation, reference symbol VCC1 denotes a voltage of a high-potential side 1a of the power supply of the integrated circuit 1, reference symbol VEE1 denotes a voltage of the low-potential side 1b of the power supply of the integrated circuit 1, reference symbol VCC2 denotes a voltage of the high-potential side 2a of the power supply of the integrated circuit 2, and reference symbol VEE2 denotes a voltage of the low-potential side 2b of the power supply of the integrated circuit 2. The internal circuit 9 may have a single-phase output or a differential output. The output impedance of the output circuit 4 is equal to the impedance of the signal transmission line 6. The impedance of the terminal resistance 8 is equal to the impedance of the signal transmission line 6. The internal circuit 9 has a high input impedance of several kΩ or more.

The signal current I1 output from the output circuit 4 is flowed into the high-potential side 2a of the power supply of the integrated circuit 2 through the signal transmission line 6, the input terminal 7, and the terminal resistance 8. If the potential difference VGAP1 is 0 volt, a DC voltage VDC1 at the input terminal 7 can be expressed by equation (7). A signal amplitude VAC1 at the input terminal 7 can be expressed by equation (8).

$$VDC1=VCC2-(I1 \times RS1)/2 \quad (7)$$

$$VAC1=I1 \times RS1 \quad (8)$$

In accordance with the signal voltages expressed by equations (7) and (8), bias design for the internal circuit 9 is performed. However, as in the conventional integrated circuit described above, the potential difference VGAP1 may not be 0 volt. In this case, with reference to the voltage VEE2, the DC voltage VDC1 and the signal amplitude VAC1 can be expressed by equations (9) and (10), respectively.

$$VDC1=VCC2-(I1 \times RS1)/2+VGAP1 \quad (9)$$

$$VAC1=(I1 \times RS1)-2VGAP1 \quad (10)$$

The detection circuit 11a has a high input impedance, and detects a bias voltage of an input signal to the input terminal 7. The superposing circuit 11b superposes a correction voltage for correcting the bias voltage to a predetermined value on the input signal on the basis of a detection result of the detection circuit 11a. More specifically, the superposing circuit 11b superposes the voltage of (−VGAP1) volt which is equal to the opposite of the potential difference VGAP1 on the input signal. In this manner, even though the potential difference VGAP1 is generated, the bias voltage of the input signal is corrected to make it possible to output a signal having a bias voltage which satisfies equation (7) to the internal circuit 9, and the internal circuit 9 can be appropriately operated.

When a voltage is superposed on an input signal, the superposing circuit 11b is set at a high input impedance such that the bias voltage of the input signal at the input terminal 7 is prevented from being changed. However, the superposing circuit 11b is set at a low input impedance with respect to a high-frequency component to prevent a pass band from being deteriorated. The input impedance of the integrated circuit 2 is determined by the resistance RS1 of the terminal resistance 8, impedance matching for the signal transmission line 6 is established, and low-reflective characteristics can be obtained at the input terminal 7. In this manner, the self-bias adjustment circuit 11 can also be applied to a signal having a high-frequency signal component.

Figure 2:
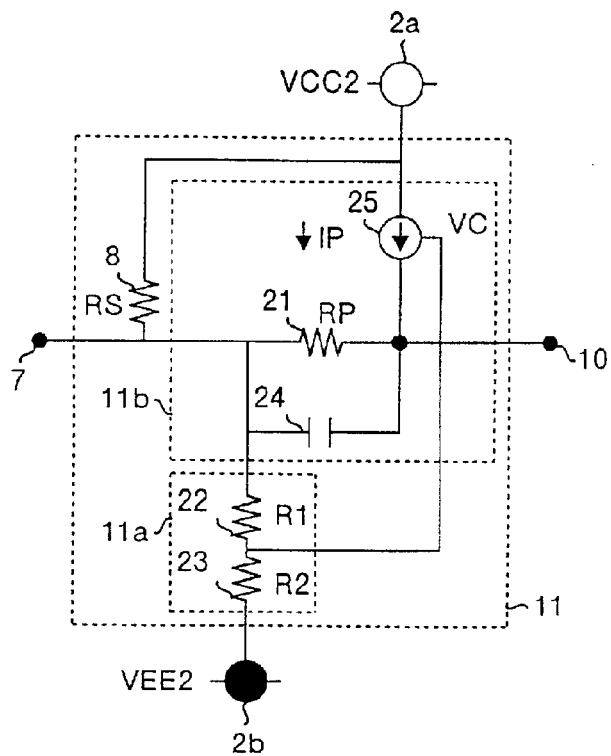
FIG. 2 is a diagram showing the schematic configuration of the detection circuit and the superposing circuit shown in FIG. 1.

FIG. 2 is a diagram showing the schematic configuration of the detection circuit 11a and the superposing circuit 11b shown in FIG. 1. The detection circuit 11a comprises resistors 22 and 23 (resistances R1 and R2) arranged in series with each other between the input terminal 7 and the low-potential side 2b of the power supply. The superposing circuit 11b comprises a resistor 21 (resistance RP), a capacitor 24 connected in parallel to the resistor 21, and a DC current output circuit 25 for outputting a DC current depending on a detection result of the detection circuit 11a to a terminal of the resistor 21 on the internal circuit side.

The detection circuit 11a outputs divided voltages divided by the resistors 22 and 23 to the DC current output circuit 25 of the superposing circuit lib as detection results. The DC current output circuit 25 outputs a DC current depending on a detection result of the detection circuit 11a. The resistances of the resistors 21, 22, and 23 are about several kΩ each. The capacitance of the capacitor 24 is about several hundred nF. The DC current output circuit 25 has a high input impedance of about several kΩ.

Figure 3:
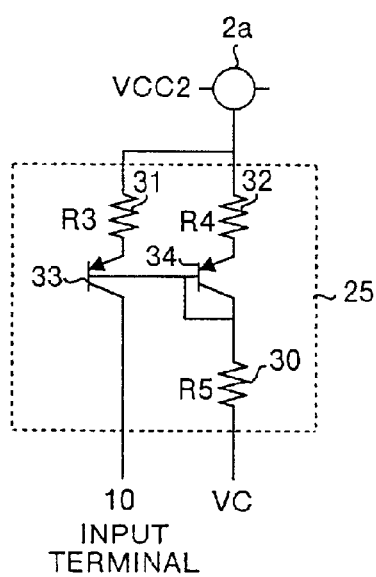
FIG. 3 is a diagram showing the schematic configuration of the DC current output circuit shown in FIG. 2.

FIG. 3 is a diagram showing the schematic configuration of the DC current output circuit 25 shown in FIG. 2. The DC current output circuit 25 comprises resistors 31 and 32 (resistances R3 and R4) one terminals of which are connected to the high-potential side 2a of the power supply, a PNP transistor 33 the emitter of which is connected to the other terminal of the resistor 31 and the collector of which is connected to the input terminal 10 of the internal circuit 9, a PNP transistor 34 the emitter of which is connected to the other terminal of the resistor 32 and the base and collector of which are connected to the base of the PNP transistor 33, and a resistor 30 (resistance R5) arranged between the collector of the PNP transistor 34 and the detection circuit 11a. The PNP transistors 33 and 34 have equal sizes and constitute a current mirror circuit.

Operation of the circuit of the first embodiment will be described below. The detection circuit 11a detects the bias voltage of the input signal. More specifically, a divided voltage VC is generated by the resistors 22 and 23, and the divided voltage VC is output to a current control terminal (one terminal of the resistor 30) of the DC current output circuit 25 as a detection result. The divided voltage VC is expressed by equation (11):

$$VC=((VCC2-(I1 \times RS1)/2)+VGAP1) \times (R2/(R1+R2)) \quad (11)$$

The voltage VC increases in accordance with the increase of the potential difference VGAP1.

An output current IP of the DC current output circuit 25 is controlled by the voltage VC of the current control terminal. Base-emitter voltages of the PNP transistors 33 and 34 are represented by VBE1, the current IP is expressed by equation (12):

$$IP=(VCC2-VC-VBE1)/(R4+R5) \quad (12)$$

The current IP increases as the voltage VC decreases, and decreases as the voltage VC increases. The IP is set to be a value which is equal to or smaller than 1/10 the signal from the output circuit 4 of the integrated circuit 1. In this manner, a variation in signal voltage level at the input terminal 7 of the integrated circuit 2 can be neglected. In addition, the current IP is set to be a value which is 10 or more times a draw current of the internal circuit 9. In this manner, a variation in signal voltage level at the input terminal 10 of the internal circuit 9 can be neglected.

The current IP output from the DC current output circuit 25 flows in the resistor 21. In this manner, a DC voltage VP expressed by equation (13) is superposed on a signal voltage generated at the input terminal 7:

$$VP=RP \times IP \quad (13)$$

The DC current output circuit 25 changes the current IP with the change of the voltage VC to change the DC voltage VP. When the DC current output circuit 25 is set such that VP=(-VGAP1) is satisfied, so that a bias voltage of the input signal can be corrected. The internal circuit 9 the bias of which is designed for a signal voltage obtained when the voltage VGAP1 is 0 volt can be appropriately operated.

When the resistor 21 having a high resistance is inserted in the signal line, a pass band of a signal frequency component is deteriorated. For this reason, in order to improve the pass band, the capacitance of the capacitor 24 is set to have a low impedance for a high frequency component.

In this manner, a low impedance is realized for a high-frequency signal component, and only the DC voltage component can be superposed on the input signal through the resistor 21 without deteriorating the high-frequency signal component.

As described above, according to the first embodiment, by using the detection circuit 11a having a high input impedance and the superposing circuit 11b having a high input impedance for a low-frequency component, the bias voltage of the input signal at the input terminal 7 of the integrated circuit 2 can be prevented from varying, and a simple terminal configuration can be realized. In addition, the detection circuit 11a detects the bias voltage of the input signal, and the superposing circuit 11b superposes the voltage of (-VGAP1) volt which is equal to the opposite of the potential difference VGAP1 on the input signal on the basis of a detection result of the detection circuit 11a. For this reason, a defective operation of the internal circuit 9 and the deterioration of a signal amplitude caused by the potential difference VGAP1 can be prevented. Furthermore, since a capacitor having a large capacity need not be inserted in the signal line, the peripheral circuit can be prevented from being increased, and, in the integrated circuit, for a signal frequency component in a wide band extending from a high frequency to a low frequency, a bias voltage of an input signal can be corrected without deteriorating the signal amplitude.

In the first embodiment described above, one terminal of the terminal resistance 8 is connected to the high-potential side 2a of the power supply. However, one terminal of the terminal resistance 8 may be connected to the low-potential side 2b of the power supply or an arbitrary bias voltage terminal in accordance with the terminal conditions of the integrated circuit 2. In this case, the same effect can be obtained. Furthermore, in the above example, the PNP transistors are used, one terminals of the resistors 31 and 32 of the current mirror current supply are connected to the high-potential side 2a of the power supply, and one terminal of the resistor 23 is connected to the low-potential side 2b of the power supply. However, depending on the internal circuit configuration of the integrated circuit 2, NPN transistors may be used in place of the PNP transistors, one terminals of the resistors 31 and 32 of the current mirror current supply may be connected to the low-potential side 2b of the power supply, and one terminal of the resistors 23 may be connected to the high-potential side 2a of the power supply. In this case, the same effect as described above can be obtained.

Figure 4:
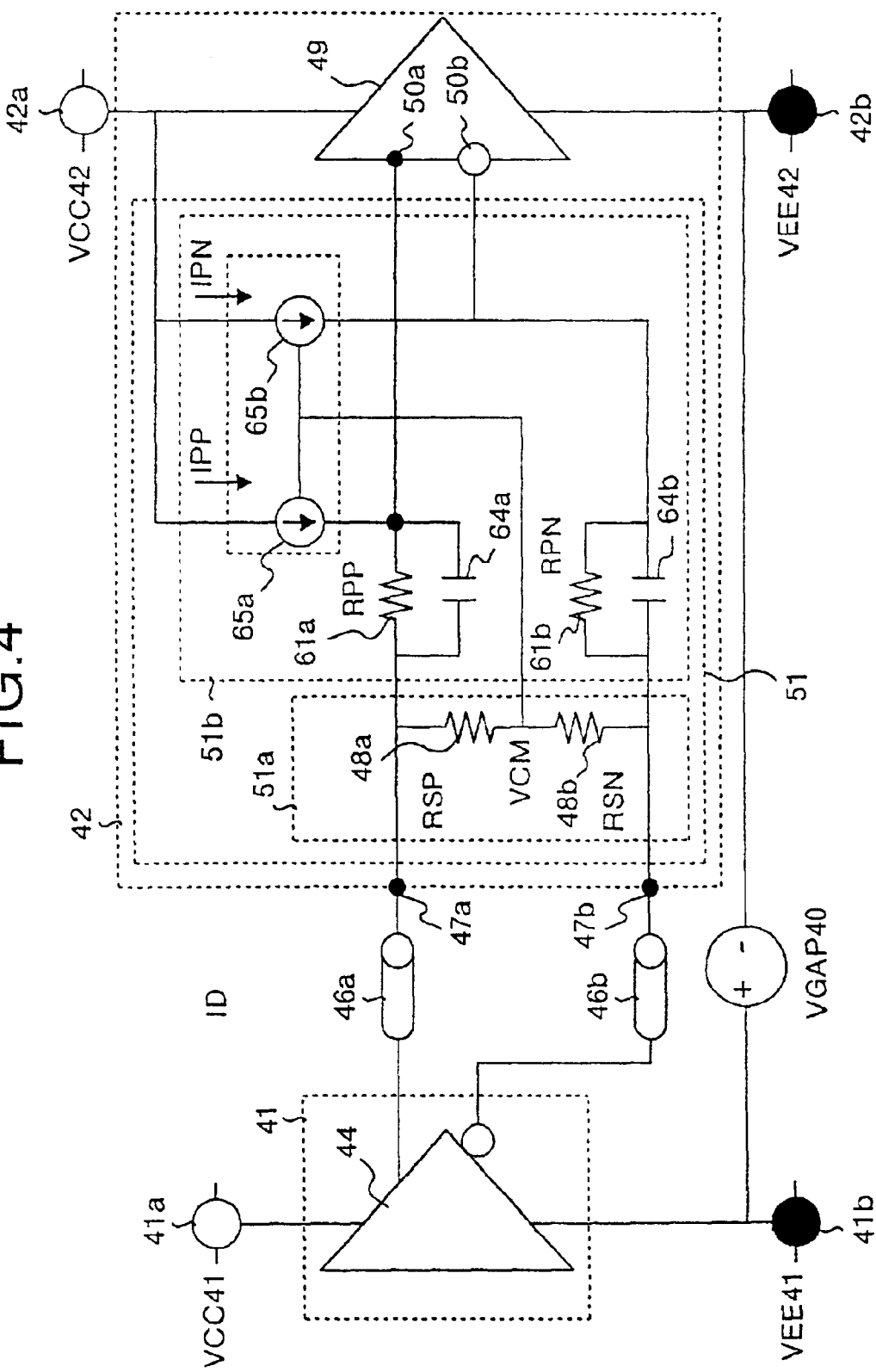
FIG. 4 is a diagram showing the schematic configuration of an integrated circuit according to a second embodiment of the present invention.

FIG. 4 is a diagram showing the schematic configuration of an integrated circuit according to a second embodiment of the present invention. This integrated circuit 42 comprises a positive-phase input terminal 47a which receives a positive-phase signal from a differential output circuit 44 of another integrated circuit 41 treating a differential signal through a positive-phase signal transmission line 46a, a negative-phase input terminal 47b which receives a negative-phase signal of the differential output circuit 44 through a negative-phase signal transmission line 46b, terminal resistors 48a and 48b (resistances RSP and RSN) arranged in series with each other between the positive-phase input terminal 47a and the negative-phase input terminal 47b, a differential internal circuit 49, and a superposing circuit 51b, arranged between the positive-phase input terminal 47a and the negative-phase input terminal 47b of the integrated circuit 42 and a positive-phase input terminal 50a and a negative-phase input terminal 50b of the differential internal circuit 49, for superposing a correction voltage for correcting a bias voltage to a predetermined value on a positive-phase input signal and a negative-phase input signal.

A potential difference VGAP40 is generated between a low-potential side 41b of the power supply of the integrated circuit 41 and a low-potential side 42b of the power supply of the integrated circuit 42. The differential output circuit 44 of the integrated circuit 41 treats a differential signal, outputs a positive-phase signal to the positive-phase signal transmission line 46a, and outputs a negative-phase signal to the negative-phase signal transmission line 46b. Terminal resistors 48a and 48b constitute a detection circuit 51a for detecting a bias voltage of an input signal. The detection circuit 51a and the superposing circuit 51b constitute a self-bias adjustment circuit 51.

The power supply voltage of the integrated circuit 41 and the power supply voltage of the integrated circuit 42 are equal to each other. More specifically, equation (14) is satisfied:

$$(VCC41-VEE41)=(VCC42-VEE42) \quad (14)$$

In this equation, reference symbol VCC41 denotes a voltage of a high-potential side 41a of the power supply of the integrated circuit 41, reference symbol VEE41 denotes a voltage of the low-potential side 41b of the power supply of the integrated circuit 41, reference symbol VCC42 denotes a voltage of a high-potential side 42a of the power supply of the integrated circuit 42, and reference symbol VEE42 denotes a voltage of the low-potential side 42b of the power supply of the integrated circuit 42.

The superposing circuit 51b comprises a resistor 61a (resistance RPP) arranged between the positive-phase input terminal 47a of the integrated circuit 42 and the positive-phase input terminal 50a of the differential internal circuit 49, a capacitor 64a connected in parallel to the resistor 61a, a DC current output circuit 65a for outputting a DC current IPP depending a detection result of the detection circuit 51a to the terminal of the resistor 61a on the internal circuit side, a resistor 61b (resistance RPN) arranged between the negative-phase input terminal 47b of the integrated circuit 42 and the negative-phase input terminal 50b of the differential internal circuit 49, a capacitor 64b connected in parallel to the resistor 61b, and a DC current output circuit 65b for outputting a DC current IPN depending on a detection result of the detection circuit 51a. On the basis of the detection result of the detection circuit 51a, a correction voltage for correcting a bias voltage to a predetermined value on a positive-phase input signal and a negative-phase input signal.

The resistance of the terminal resistor 48a is equal to an impedance value of the positive-phase signal transmission line 46a. The resistance of the terminal resistor 48b is equal to an impedance value of the negative-phasesignaltransmissionline46b. The resistors 61a and 61b have a resistance of about several kΩ each. The capacitors 64a and 64b have a capacitance of about several hundred nF each. The DC current output circuits 65a and 65b have a high input impedance of about several kΩ each. The internal circuit 9 has a high input impedance. In this manner, input impedances of the positive-phase input terminal 47a and the negative-phase input terminal 47b of the integrated circuit 42 are determined by the terminal resistors 48a and 48b, respectively, and impedance matching for the positive-phase signal transmission line 46a and the negative-phase signal transmission line 46b is established.

If a signal has a high-frequency component, low-reflective characteristics are obtained at the positive-phase input terminal 47a and the negative-phase input terminal 47b, and high-frequency signal components are not deteriorated by adding the resistors 61a and 61b and the capacitors 64a and 64b. A state in which a signal current ID from the integrated circuit 41 flows into the negative-phase input terminal 47b through the terminal resistors 48a and 48b and a state in which the signal current ID is drawn from the negative-phase input terminal 47b are made, and a differential signal voltage VD expressed by equation (15):

$$VD=ID\times(RSP+RSN) \quad (15)$$

The differential signal voltage VD is not deteriorated by adding the resistors 61a and 61b and the capacitors 64a and 64b.

Figure 5:
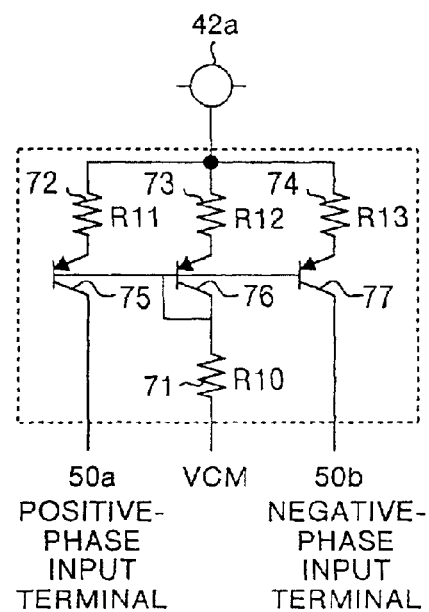
FIG. 5 is a diagram showing the schematic configuration of the DC current output circuit shown in FIG. 4.
Figure 6:
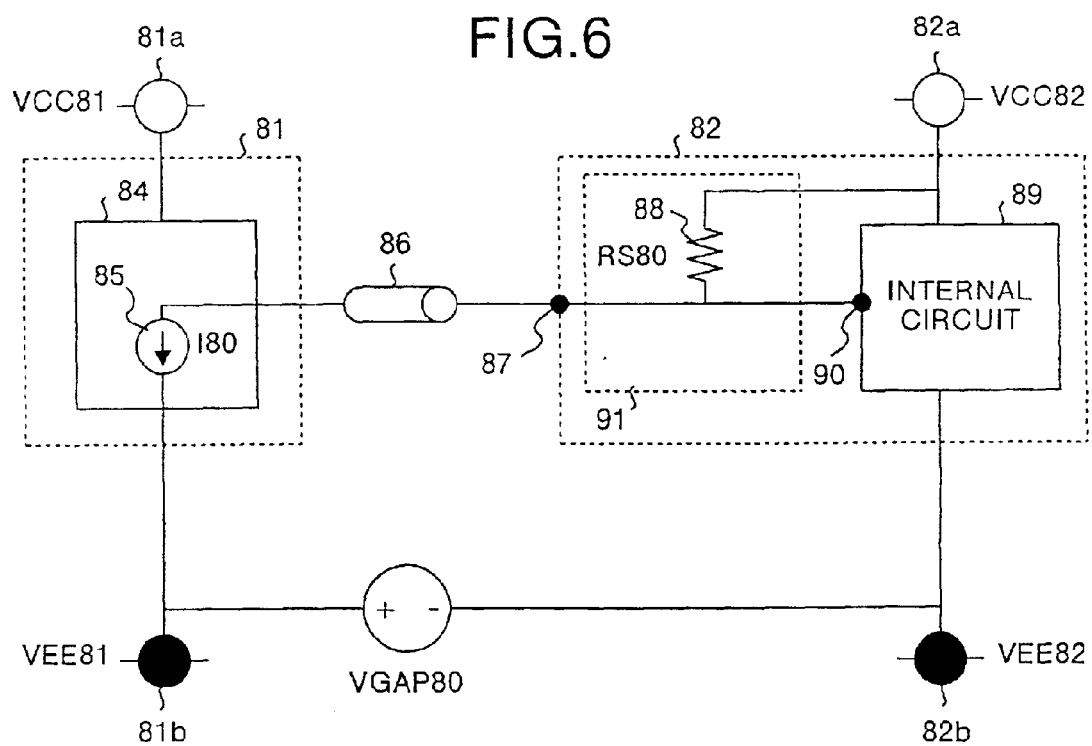
FIG. 6 is a diagram showing the configuration of an integrated circuit including a conventional self-bias adjustment circuit.

FIG. 5 is a diagram showing the schematic configuration of the DC current output circuits 65a and 65b shown in FIG. 4. The DC current output circuits 65a and 65b are integrally arranged, and comprises resistors 72, 73, and 74 (resistances R11, R12, and R13) one terminals of which are connected to the high-potential side 42a of the power supply, a PNP transistor 75 the emitter of which is connected to the other terminal of the resistor 72 and the collector of which is connected to the positive-phase input terminal 50a of the differential internal circuit 49, a PNP transistor 77 the emitter of which is connected to the other terminal of the resistor 74 and the collector of which is connected to the negative-phase input terminal 50b of the differential internal circuit 49, a PNP transistor 76 the emitter of which is connected to the other terminal of the resistor 73 and the base and collector of which are connected to the bases of the PNP transistors 75 and 77, and a resistor 71 (resistance R10) arranged between the collector of the PNP transistor 76 and a detection circuit 48.

The PNP transistors 75, 76, and 77 have the same sizes, and constitute a current mirror circuit. All the resistances R11, R12, and R13 of the resistors 72, 73, and 74 are equal to each other, and R11=R12=and R13 is satisfied.

Operation of the circuit of the second embodiment will be described below. The detection circuit 51a detects a bias voltage of an input signal. More specifically, by divided resistors 48a and 48b, a common mode voltage VCM serving as an offset voltage between the positive-phase input terminal 47a and the negative-phase input terminal 47b of the integrated circuit 42 is generated, and the common mode voltage VCM is output as a detection result to the current control terminals (one terminal of the resistor 71) of the DC current output circuits 65a and 65b.

The output current IPP of the DC current output circuit 65a and the output current IPN of the DC current output circuit 65b are controlled by the common mode voltage VCM. When base-emitter voltages of the PNP transistor 75 to 77 are represented by VBE2, the current IPP and the current IPN are expressed by equation (16):

$$IPP=IPN=(VCC2-VCM-VBE2)/(R10+R12) \quad (16)$$

The currents IPP and IPN increase as the common mode voltage VCM decreases, and decreases as the common mode voltage VCM increases. The currents IPP and IPN are set to be equal to or smaller than 1/10 a signal current ID from the differential output circuit 44 of the integrated circuit 41. In this manner, variations in signal voltage level at the input terminals 47a and 47b of the integrated circuit 42 can be neglected. In addition, the currents IPP and IPN are set to be equal to or larger than 10 times the draw current of the differential internal circuit 49. In this manner, variations in signal voltage level at the input terminals 50a and 50b of the differential internal circuit 49 can be neglected.

The currents IPP and IPN respectively output from the DC current output circuits 65a and 65b flow in the resistors 61a and 61b. In this manner, DC voltage VPP and VPN expressed by equation (17) and equation (18) are superposed on signal voltages generated by the input terminals 47a and 47b, respectively:

$$VPP=RPP\times IPP \quad (17)$$

$$VPN=RPN\times IPN \quad (18)$$

When the potential difference VGAP40 is generated, a voltage of VGAP40 volt is added to the common mode voltage VCM, and the common mode voltage VCM increases as the potential difference VGAP40 increases. The DC current output circuits 65a and 65b respectively change the currents IPP and IPN in accordance with the change of the common mode voltage VCM to respectively change the DC voltages VPP and VPN. When the DC current output circuits 65a and 65b are set such that VPP−VPN=(−VGAP40) is satisfied, a bias voltage of an input signal can be corrected, and the differential internal circuit 49 the bias of which is designed in accordance with a signal voltage obtained when the VGAP40 is 0 volt can be appropriately operated.

When the resistors 61a and 61b each having a high resistance are inserted in the signal line, the pas band of the signal frequency component is deteriorated. For this reason, in order to improve the pass band, the capacitances of the capacitors 64a and 64b are set such that a low impedance is achieved for a high-frequency component. In this manner, a low impedance can be realized for a high-frequency signal component, and only a DC voltage component can be superposed on an input signal through the resistors 61a and 61b without deteriorating the high-frequency signal component.

As described above, according to the second embodiment, since the resistors 61a and 61b each having a high resistance are arranged on the signal line, the input impedance of the integrated circuit 42 is determined by the terminals 48a and 48b, and a simple terminal configuration can be realized. The common mode voltage VCM between the positive-phase input terminal 47a and the negative-phase input terminal 47b in the integrated circuit 42 is detected, and the output currents IPP and IPN from the DC current output circuits 65a and 65b are controlled by using the common mode voltage VCM such that the DC voltages VPP and VPN are (−VGAP) volt each, and the DC voltages VPP and VPN are superposed on an input signal of the integrated circuit 42.

In this manner, a defection operation of the differential internal circuit 49 and the deterioration of a signal amplitude caused by the potential difference VGAP40 can be prevented. In addition, since a large-capacity capacitor need not be inserted in the signal line, a peripheral circuit can be suppressed being increased in size. In the integrated circuit, for a signal frequency component in a wide band extending from a high frequency to a low frequency, a bias voltage of an input signal can be corrected without deteriorating a signal amplitude.

The second embodiment explained the case in which PNP transistors are used, and one terminals of the resistors 72, 73, and 74 of the current mirror current source are connected to the high-potential side 42a of the power supply. However, depending on the internal circuit configuration of the integrated circuit 42 NPN transistor may be used in place of a PNP transistor, and one terminals of the resistors 72, 73, and 74 of the current mirror current source may be connected to the low-potential side 42b of the power supply. In this case, the same effect as described above can be obtained. The first and second embodiments explained the case in which a self-bias adjustment circuit is applied to an integrated circuit. However, the self-bias adjustment circuit may be applied to not only an integrated circuit but also a discrete circuit. In this case, the same effect as described above can be obtained.

As described above, according to this invention, influence of a potential difference on the low-potential side of the power supply can be suppressed without using a large-capacity capacitor. Therefore, the internal circuit is appropriately operated while suppressing an increase in size of the device and an increase in cost to make it possible to reduce a deterioration of a signal amplitude is achieved. Furthermore, the detection unit has a simple circuit configuration. Therefore, cost reduction becomes possible. Furthermore, DC current depending on a detection result can be output.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A self-bias adjustment circuit, arranged on a previous stage of an internal circuit, for adjusting a bias of an input signal, the self-bias adjustment circuit comprising:

a detection unit which detects a bias voltage of the input signal; and a superposing unit which superposes a correction voltage, for correcting the bias voltage to a predetermined value, on the input signal on the basis of the bias voltage detected by the detection unit to output a corrected input signal to the internal circuit, wherein the superposing unit is constructed such that it has a high input impedance with respect to the bias voltage and a low input impedance with respect to a high-frequency component of the input signal.

2. A self-bias adjustment circuit according to claim 1, wherein the detection unit has a plurality of resistors arranged in series with each other between a low-potential side of a power supply or a high-potential side of the power supply and an input terminal to which the input signal is input, and outputs divided voltages divided by the plurality of resistors as detection results.

3. A self-bias adjustment circuit, arranged on a previous stage of an internal circuit, for adjusting a bias of an input signal, the self-bias adjustment circuit comprising:

a detection unit which detects a bias voltage of the input signal; and a superposing unit which superposes a correction voltage, for correcting the bias voltage to a predetermined value, on the input signal on the basis of the bias voltage detected by the detection unit to output a corrected input signal to the internal circuit, wherein the superposing unit includes, a first resistor arranged between an input terminal to which the input signal is input and an input terminal of the internal circuit;

a capacitor connected to the first resistor in parallel to each other; and a DC current output unit which outputs a DC current depending on a detection result of the detection unit to a terminal of the first resistor on the internal circuit side.

4. The self-bias adjustment circuit according to claim 3, wherein the DC current output unit includes, a second resistor and a third resistor having terminals connected to a low-potential side of the power supply or a high-potential side of the power supply;

a first transistor the emitter of which is connected to the other terminal of the second resistor and the collector of which is connected to the terminal of the first resistor on the internal circuit side;

a second transistor the emitter of which is connected to the other terminal of the third resistor and the base and collector of which are connected to the base of the first transistor; and a fourth resistor arranged between the collector of the second transistor and the detection unit.

5. A self-bias adjustment circuit, arranged on a previous stage of an internal circuit, for adjusting a bias of an input signal, the self-bias adjustment circuit comprising:

a detection unit which detects a bias voltage of the input signal; and a superposing unit which superposes a correction voltage, for correcting the bias voltage to a predetermined value, on the input signal on the basis of the bias voltage detected by the detection unit to output a corrected input signal to the internal circuit, wherein the input signal includes a positive-phase input signal and a negative-phase input signal, the detection unit includes a plurality of terminal resistors arranged in series with each other between a positive-phase input terminal to which the positive-phase input signal is input and a negative-phase input terminal to which the negative-phase input signal is input, terminates the input signal by using the plurality of terminal resistors, and outputs divided voltages divided by the plurality of terminal resistors as detection results.

6. A self-bias adjustment circuit, arranged on a previous stage of an internal circuit, for adjusting a bias of an input signal, the self-bias adjustment circuit comprising:

a detection unit which detects a bias voltage of the input signal; and a superposing unit which superposes a correction voltage, for correcting the bias voltage to a predetermined value, on the input signal on the basis of the bias voltage detected by the detection unit to output a corrected input signal to the internal circuit, wherein the input signal includes a positive-phase input signal and a negative-phase input signal, and the superposing unit includes:

a first resistor arranged between the positive-phase input terminal to which the positive-phase input signal is input and a positive-phase input terminal of the internal circuit;

a first capacitor connected to the first resistor in parallel to each other;

a first DC current output unit which outputs a DC current depending on a detection result of the detection unit to a terminal of the first resistor on the internal circuit side;

a second resistor arranged between the negative-phase input terminal to which the negative-phase input signal is input and a negative-phase input terminal of the internal circuit;

a second capacitor connected to the second resistor in parallel to each other; and a second DC current output unit which outputs a DC current depending on a detection result of the detection unit to a terminal of the second resistor on the internal circuit side.

7. The self-bias adjustment circuit according to claim 6, wherein the first DC current output unit and the second DC current output unit are integrated into one unit, and said one unit includes, a third resistor, a fourth resistor, and a fifth resistor one terminals of which are connected to a low-potential side of a power supply or a high-potential side of the power supply;

a first transistor the emitter of which is connected to the other terminal of the third resistor and the collector of which is connected to the terminal of the first resistor on the internal circuit side;

a second transistor the emitter of which is connected to the other terminal of the fourth resistor and the collector of which is connected to the terminal of the second resistor on the internal circuit side;

a third transistor the emitter of which is connected to the other terminal of the fifth resistor and the base and collector of which are connected to the base of the second transistor; and a sixth resistor arranged between the collector of the third transistor and the detection unit.

8. The self-bias adjustment circuit according to claim 7, wherein the base and collector of the third transistor is connected to the base of the first transistor.

9. The self-bias adjustment circuit according to claim 1, wherein the input signal is input externally.

10. A method for adjusting a bias of an external input signal by a self-bias adjustment circuit, which is arranged on a previous stage of an internal circuit, the method comprising the steps of:

detecting a bias voltage of the input signal by a detection unit;

superposing a correction voltage with a superposing unit, for correcting the bias voltage to a predetermined value, wherein the input signal is corrected on the basis of the bias voltage detected by the detection unit; and outputting a corrected input signal to the internal circuit from the superposing unit, wherein the superposing unit has a high input impedance with respect to the bias voltage and a low input impedance with respect to a high-frequency component of the input signal.

* * * * *